(12) United States Patent
Suaya et al.

(10) Patent No.: US 7,260,796 B2
(45) Date of Patent: *Aug. 21, 2007

(54) CAPACITANCE MEASUREMENTS FOR AN INTEGRATED CIRCUIT

(76) Inventors: Roberto Suaya, 8 Allee de la Roseraie, 38240 Meylan (FR); Sophie H. M. Gabillet, 23 Rue de Tournelles, 92290 Chatenay Malabry (FR)

( * ) Notice: Subject to any disclaimer, the term of this patent is extended or adjusted under 35 U.S.C. 154(b) by 73 days.

This patent is subject to a terminal disclaimer.

(21) Appl. No.: 11/129,656

(22) Filed: May 13, 2005

(65) Prior Publication Data

US 2005/0268260 A1    Dec. 1, 2005

Related U.S. Application Data

(63) Continuation of application No. 09/385,666, filed on Aug. 26, 1999, now Pat. No. 6,934,669.

(51) Int. Cl.
*G06F 17/50* (2006.01)
*G01R 31/08* (2006.01)
*G01R 27/26* (2006.01)

(52) U.S. Cl. .................. 716/4; 716/5; 716/6; 324/519; 324/678

(58) Field of Classification Search ................ 716/4–6; 324/519, 658, 678
See application file for complete search history.

(56) References Cited

U.S. PATENT DOCUMENTS

| 5,212,454 | A | 5/1993 | Proebsting |
| 5,790,436 | A | 8/1998 | Chen et al. |
| 5,901,063 | A | 5/1999 | Chang et al. |
| 5,999,010 | A | 12/1999 | Arora et al. |
| 6,011,731 | A | 1/2000 | Beigel et al. |
| 6,249,903 | B1 | 6/2001 | McSherry et al. |
| 6,300,765 | B1 | 10/2001 | Chen |
| 6,366,098 | B1 * | 4/2002 | Froment .................. 324/678 |
| 6,414,498 | B2 | 7/2002 | Chen |
| 6,934,669 | B1 | 8/2005 | Suaya et al. |

OTHER PUBLICATIONS

McGaughy et al., "*A Simple Method for On-Chip, Sub-Femto Farad Interconnect Capacitance Measurement*", IEEE Electron Device Letters, vol. 18. No. 1, Jan. 1997.

(Continued)

*Primary Examiner*—Paul Dinh
(74) *Attorney, Agent, or Firm*—Klarquist Sparkman LLP

(57) ABSTRACT

A method and apparatus for determining capacitance of wires in an integrated circuit is described. The capacitance information derived according to the invention can be used, for example, to calibrate a parasitic extraction engine or to calibrate an integrated circuit fabrication process. The capacitance information can also be used for timing and noise circuit simulations, particularly for deep sub-micron circuit design simulations. Briefly, the invention allows measurement of both total capacitance of a line and cross coupling capacitance between two lines by applying predetermined voltage signals to specific circuit elements. The resulting current allows simple computation of total capacitance and cross coupling capacitance. Multiple cross coupling capacitance can be measured with a single device, thus improving the art of library generation, and the overall method is free of uncertainties related to transistor capacitance couplings. The capacitance values obtained can then be used to calibrate procedures, processes, devices, etc.

34 Claims, 8 Drawing Sheets

OTHER PUBLICATIONS

Chen et al., Proper On-Chip Capacitance Measurement >> (1999). p. 1-5. Mentor Graphics www.mentor.com/dsm.

DeBroff et al., "Electromagnetic Concepts and Applications" (1996). p. 528-529, 534-535. Prentice-Hall Inc., ISBN 0-13-301151-8.

Chen et al., "An On-Chip, Attofarad Interconnect Charge-based Capacitance Measurement Technique", IEEE, 1996, pp. 3.4.1-3.4.4.

Sylvester et al., "Investigation of Interconnect Capacitance Characterization using Charge-based Capacitance Measurement Technique and 3-D Simulation", IEEE, 1997, pp. 491-494.

* cited by examiner

FIG. 7
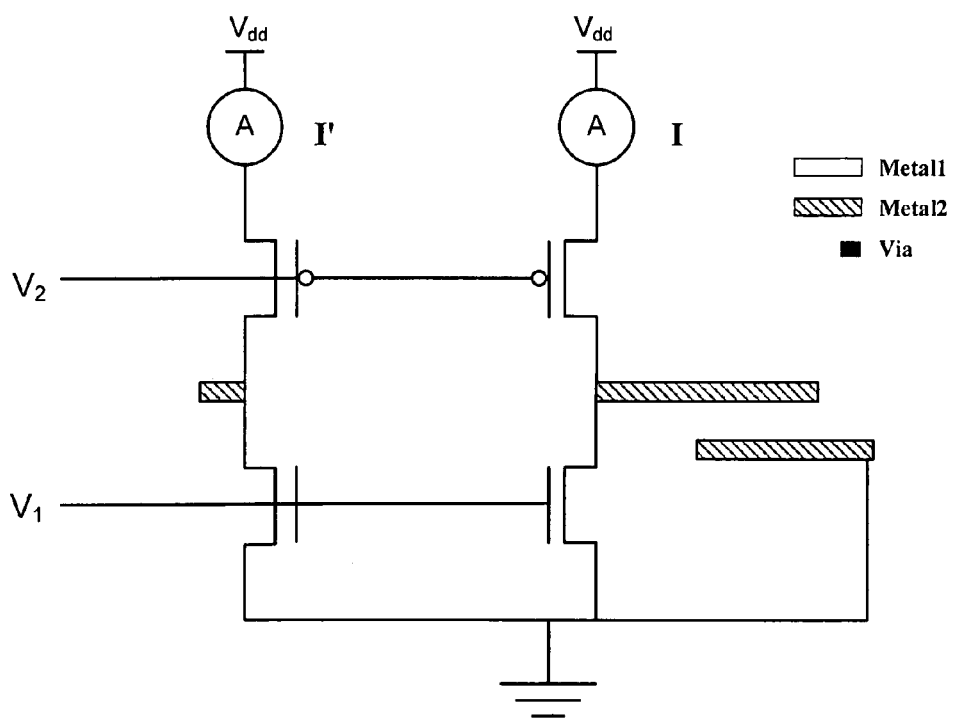
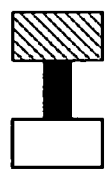
Side View
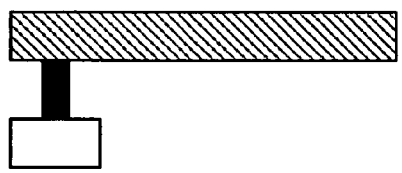
Side View

CAPACITANCE MEASUREMENTS FOR AN INTEGRATED CIRCUIT

CROSS REFERENCE TO RELATED APPLICATION

This application is a continuation of U.S. patent application Ser. No. 09/385,666, filed Aug. 26, 1999, now U.S. Pat. No. 6,934,669 which is hereby incorporated by reference.

FIELD OF THE INVENTION

The invention relates to circuit design parameter measurement. More particularly, the invention relates to a method and apparatus for high precision measurement of cross coupling and total capacitance of wires on an integrated circuit design.

BACKGROUND OF THE INVENTION

Until the advent of deep sub micron integrated circuit processes, timing behavior of integrated circuits has been dictated by transistor considerations, mostly transistor travel time and the number of logic levels a signal traverses during a clock cycle. Accurate models of transistor device parameters were the key element for the prediction of circuit timing behavior.

For feature sizes larger than 0.35 µm wire delay is typically less than 20% of total timing delay. To account for the 20% contribution to total timing delay high precision delay estimates were not required for wire delay. A relatively large (e.g., 25%) uncertainty in extracting resistance and/or capacitance values results in approximately a 4% overall error in time delay modeling.

Computer aided design (CAD) programs used for integrated circuit design used simplified models to compute wire delay from resistance and capacitance data extracted using a layout database. Resistance and capacitance models that provide less than 25% uncertainty are well known in the art. For example, resistance estimates can be generated based on the geometric shape of the line to be estimated. Capacitance estimates can be generated based on a parallel plate capacitor model with perimeter fringe contribution corrections. These modeling approaches are useful for integrated circuit designs having device sizes greater than 0.35 µm.

However, as device sizes decrease the relative importance of wire delay increases. Wire extraction programs can be calibrated with accurate measurements of capacitance. One approach to accurate wire capacitance measurement is provided by B. W. McGaughy, J. C. Chen, D. Sylvester and C. Hu "A Simple Method for On-Chip Sub-Femto Farad Interconnect Capacitance Measurement," *IEEE Electron. Device Letters*, Vol. 18, No. 1, pp. 21-23, Jan. 1997, (hereinafter referred to as "the IEEE paper"), which discloses a method for determining cross coupling capacitance. However, the method described in the IEEE paper suffers shortcomings that are explained in detail in a white paper by J. C. Chen and Roberto Suaya entitled "Proper On-Chip Capacitance Measurement," (hereinafter referred to as "the white paper"). A brief overview of the white paper is provided below.

FIG. 1 represents the circuit 10 used in the IEEE paper to measure cross coupling capacitance. A general method to measure capacitance consists of measuring the total charge deposited on the capacitor, which can be accomplished by measuring DC currents, frequency of applied signals, and voltage. The following formula permits the determination of capacitance:

$$I = CV_{dd}f \qquad \text{(Equation 1)}$$

where I is a DC current reading, C is a load capacitance, $V_{dd}$ is the voltage supply level, and $f$ is the frequency of the waveforms applied.

The voltage waveform of FIG. 2 used in the IEEE paper are non-overlapping waveforms that provide, except for leakage, no current path between $V_{dd}$ and ground in the circuit of FIG. 1. In the IEEE paper, the unknown capacitance is measured as the difference between two current readings on the two current meters 12, 14 in FIG. 1. The process is flawed because of charge redistribution. The capacitance coupling between two structures, depends on the presence of other nearby structures.

Consider in FIG. 1, two identical load structures, C and C'. The capacitance of C to ground on the right side of the structure is different from the capacitance C' to ground on the left side. The difference is due to the redistribution of the electric field due to the presence of the second conductor 16. The capacitance difference can be quite large.

Configurations like the one shown in FIG. 3, where the load wire 18 and its neighbors 20, 22 are on the same physical layer and are separated by minimum distance, constitute a case where the direct application of the method of the IEEE paper would result in up to 70% error in the extraction of the unknown cross coupling capacitance. There is, in addition, the uncertainty related to the lack of equality in the capacitance of the transistors on the two sides of the mirror structure. This additional source of error becomes more significant as the device size decreases.

SUMMARY OF THE INVENTION

A method and apparatus for determining cross coupling capacitance of wires in an integrated circuit. A first predetermined signal is applied to a first wire. A second predetermined signal is applied to a second wire that is parallel to the first wire. A cross coupling capacitance between the first wire and the second wire is determined based, at least in part, on a current signal.

BRIEF DESCRIPTION OF THE DRAWINGS

The invention is illustrated by way of example, and not by way of limitation in the figures of the accompanying drawings in which like reference numerals refer to similar elements.

FIG. 7 is an example that is similar to the example of FIG. 1.

DETAILED DESCRIPTION

In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The invention provides a method and apparatus for determining cross coupling capacitance of wires in an integrated circuits. Total capacitance can be determined by adding the different cross coupling capacitance. The capacitance information derived according to the invention can be used, for example, to calibrate a parasitic extraction engine or to calibrate an integrated circuit fabrication process. The capacitance information can also be used to improve timing and noise simulations of circuits particularly for deep submicron circuits since wire capacitance effects play a dominant role for deep submicron circuits.

Briefly, the invention allows the measurement of cross coupling capacitance between two lines by applying predetermined voltage signals to specific circuit elements. The resulting current allows for simple computation of cross coupling capacitance, and total capacitance by addition. The capacitance values obtained can then be used to calibrate extraction engines, processes, and provide input to timing and noise simulators.

Figure 1:
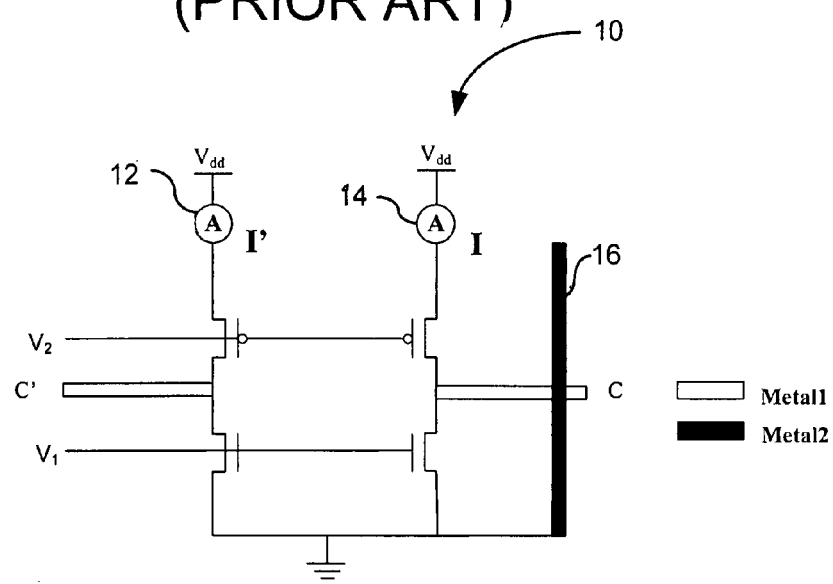
FIG. 1 is a prior art circuit for use in measuring cross coupling capacitance.
Figure 2:
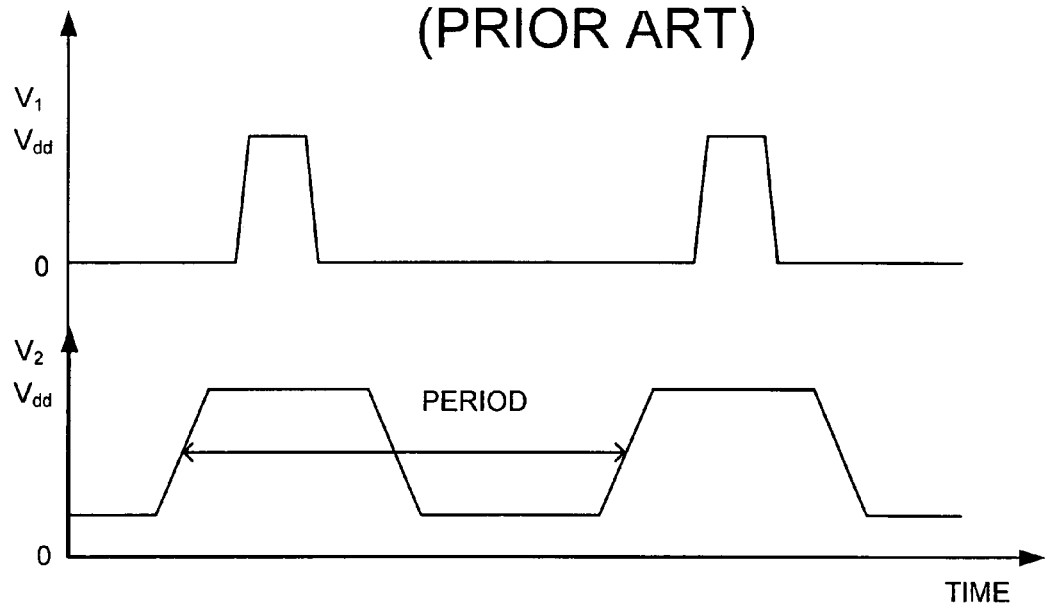
FIG. 2 is a voltage waveform for use to measure the capacitance of the circuit of FIG. 1.
Figure 3:
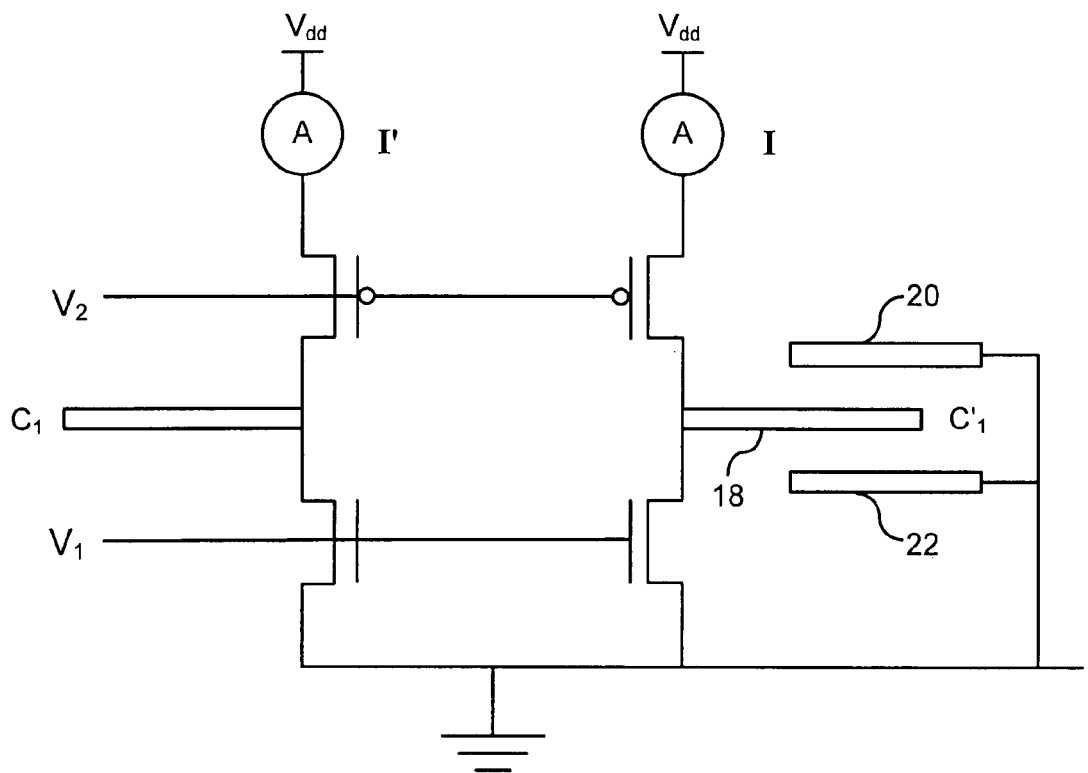
FIG. 3 is a prior art circuit for measuring cross coupling capacitance between parallel wires on the same layer that leads to large errors.
Figure 4:
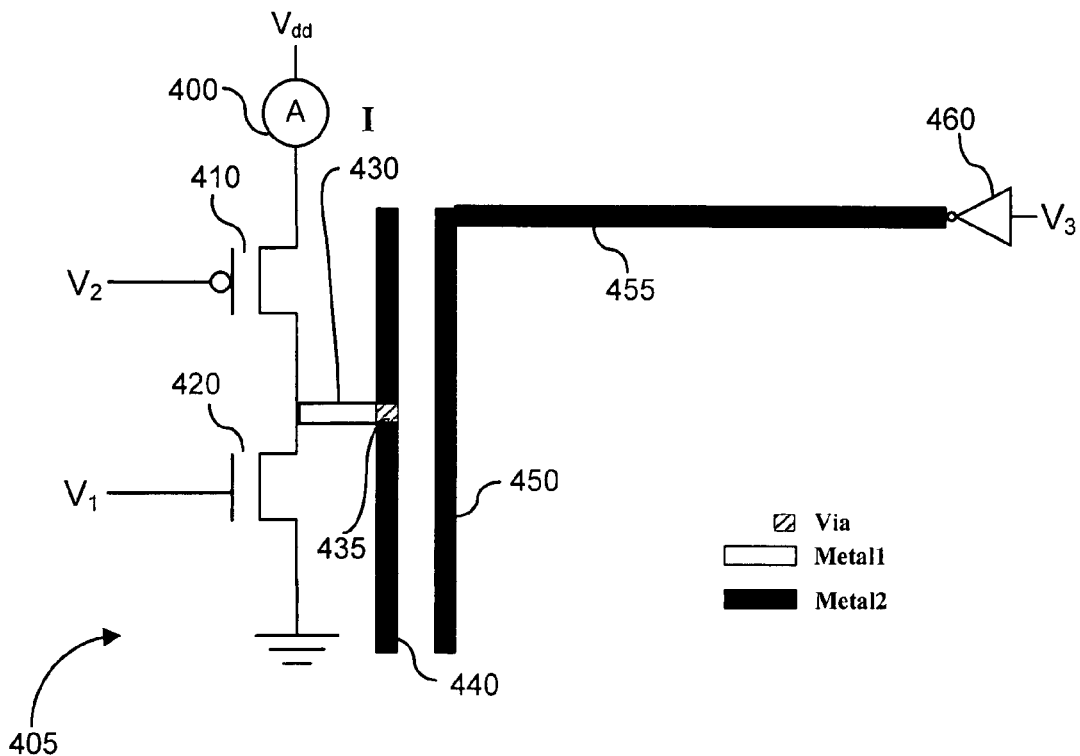
FIG. 4 is a circuit suitable for use in determining cross coupling capacitance according to one embodiment of the invention.

FIG. 4 is a circuit suitable for use in determining cross coupling capacitance according to one embodiment of the invention. The circuit of FIG. 4 removes transistor mismatch and charge redistribution errors, which improves the accuracy of measurement as compared to FIGS. 1 and 3 above.

The main structure 405 of FIG. 4 includes ammeter 400, transistor 410, transistor 420 and a minimum size structure that connects load wire 440 with the main structure. In the example of FIG. 4, load wire 440 and neighbor wire 450 are on the Metal2 layer; however, the particular metal layer or layers the wires are on is not relevant. In the embodiment of FIG. 4, load wire 440 is coupled to the main structure by Metal1-via-Metal2 structure 435 and wire 430.

The circuit of FIG. 4 is used to measure cross coupling capacitance between wire 440 and wire 450. Inverter 460 is coupled to wire 450 by wire 455. In one embodiment, inverter 460 is far enough away from the main structure to reduce noise input on wire 400.

Figure 5:
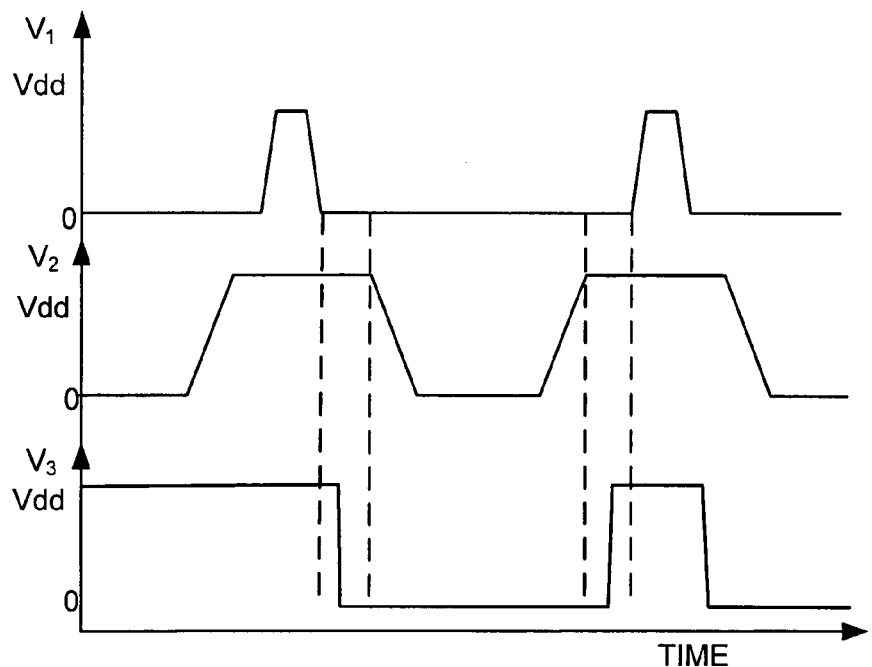
FIG. 5 is a voltage waveform for use in measuring the cross coupling capacitance of the circuit of FIG. 4 according to one embodiment of the invention.

FIG. 5 is a voltage waveform for use in measuring the cross coupling capacitance of the circuit of FIG. 4 according to one embodiment of the invention. Voltage $V_1$ is applied to the gate of transistor 420. Voltage $V_2$ is applied to the gate of transistor 410. Voltage $V_3$ is input to inverter 460. Referring back to FIG. 4, only the portion of the line (i.e., wire 450 and 455) driven by $V_3$ (i.e., wire 450) gives an appreciable contribution to the cross coupling capacitance affecting line segment 440. Capacitance measuring for the circuit of FIG. 4 using the voltage waveforms of FIG. 5 are described below.

Figure 6:
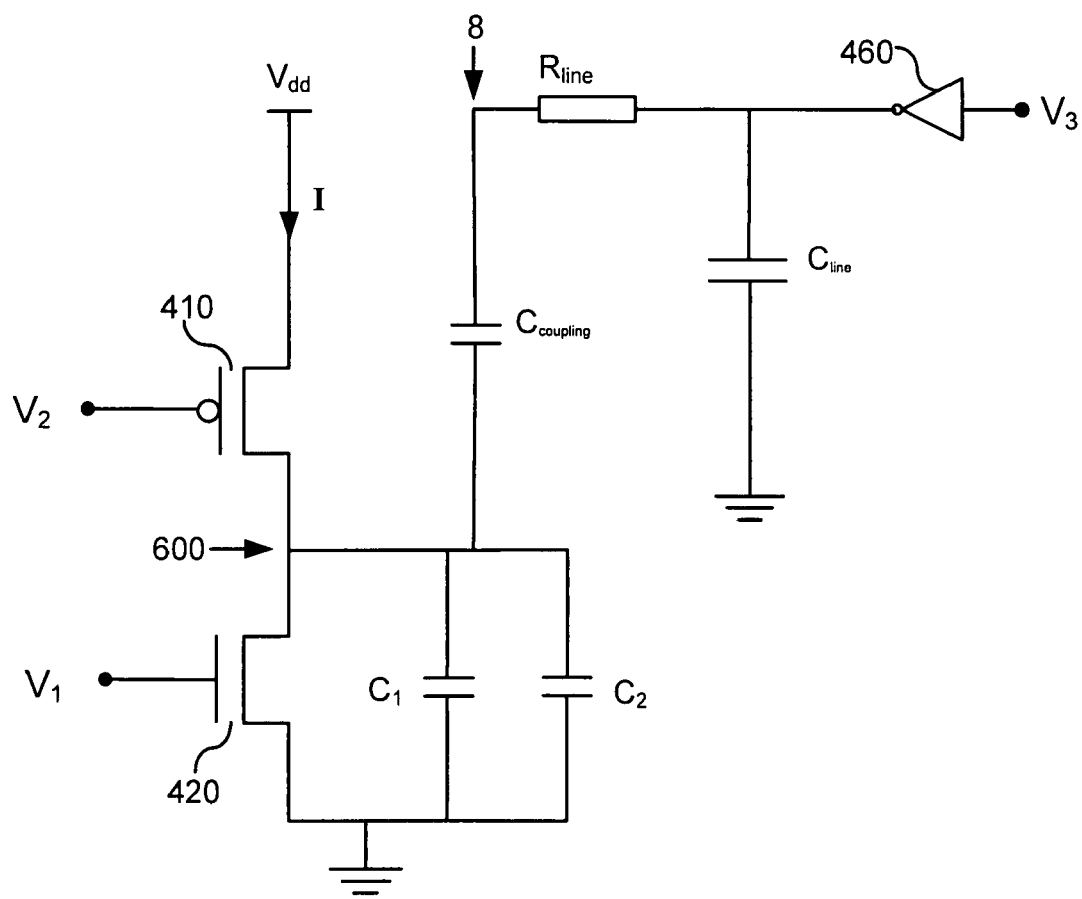
FIG. 6 is an equivalent circuit diagram corresponding to the circuit of FIG. 4.

FIG. 6 is an equivalent circuit diagram corresponding to the circuit of FIG. 4. With reference to the circuit of FIG. 6, the following name convention applies: $C_1$, $C_2$, $C_{line}$, and $C_{coupling}$ refer, respectively, to transistor plus Metal1-via-Metal2 minimum structure and other parasitic capacitances to ground, Metal2 ground capacitance, total capacitance of nearest neighbor, and the capacitance coupling between wires 440 and 450.

Before applying the voltage waveforms of FIG. 5 a voltage $V_3=V_{dd}$, (or ground) is applied to the external inverter 460. Ammeter 400 is used to measure the charge, Q, that flows into node 600 of FIG. 6. Node 600 gets charged when $V_2=V_1=0$, and this charge is equal to:

$$Q=I/f=(C_1+C_2+C_{coupling})V_{dd} \quad \text{(Equation 2)}$$

The measurement proceeds by applying for a sufficiently large number of cycles a periodic signal to $V_3$, having the same frequency as the signal applied to $V_1$, $V_2$. The relative rise and fall times of the external signals do not matter.

Following the discharge to ground of transistor 420, $V_3$ is switched to ground, and $C_{coupling}$ is charged to $V_{dd}$. This charge redistributes among the capacitors because node 600 is in a high impedance state. The intermediate voltage at node 600 is not important, provided that the switching of transistors 420 and 410 is not altered. Next, $V_1$ is switched to ground and $$Q'=(C_1+C_2)V_{dd} \quad \text{(Equation 3)}$$

flows into node 600. The difference between the direct current readings represented by Equations 2 and 3, (when $V_3=V_{dd}$, on static mode, and when $V_3=0$ on periodic mode) normalized to $V_{dd}$ identifies $C_{coupling}$.

$$C_{coupling}=(Q-Q')/V_{dd} \quad \text{(Equation 4)}$$

The measurement of $C_{coupling}$ in the circuit of FIG. 4 (represented by an equivalent circuit in FIG. 6) is free of transistor capacitance influence and insensitive to charge redistribution errors, as compared to the dual mirror structured circuits described in the IEEE paper. However, errors due to a minimum size probe reaching the Metal2 configuration and errors arising from coupling to the orthogonal portion of the aggressor wire to the wire under test remain. In one embodiment, for a 0.25 µm process with SiO dielectric, the error bound is 0.02 fF. The magnitude of this error decreases with scaling and lower permitivity dielectric materials. Thus, the measurement described with respect to FIGS. 4-6 allows highly accurate measurement of cross coupling capacitance.

In an alternative embodiment, ammeter 400 can be placed between the source of transistor 420 and ground. This alternative embodiment provides the same accuracy and the embodiments described with respect to FIGS. 4-6.

The measurement technique described with respect to FIGS. 4-6 is based on static charge measurement. To the extent that the dielectric constant of the medium is frequency independent, the total deposited charge is frequency independent. Statistical error can be made negligible by performing multiple charge measurements at the same and different frequencies, or alternatively, measuring the slope of the charge as a function of $V_{dd}$. Both techniques provide a $\sqrt{n}$ improvement in the statistical error, where n is the number of measurements.

The technique of the invention provides improved calibration of several capacitance elements with a single structure because the technique is extensible to simultaneous and non simultaneous switching of multiple neighbors. The timing scheme is similar to the single wire case, with the addition of another voltage signal $V_4$ feeding via another inverter the second neighbor wire. There are two choices for the timing of $V_4$: 1) $V_3=V_4$, the simultaneous switching of the two wires (in this case, the two neighbor wires are identical, and $2C_{coupling}$ is determined thereby halving the absolute error on $C_{coupling}$); or 2) the central wire to the two neighbor wires are determined independently with the same library element, thereby saving valuable space on the silicon chip ($V_4$ has the same sequencing as $V_3$, except that $V_4=V_{dd}$ while $V_3$ is periodic).

The neighbors can be on different metal layers. For example, a general nearest neighbor configuration can consist of nine wires on three metal layers, where, with one library element one can measure all the couplings from the middle wire in the middle layer to each of its neighbors. There are eight couplings that can be measured with one library element via a direct extension of the last procedure. The overall configuration consists of two $V_{dd}$ lines, one common ground line, two voltages feeding, the N and P transistors of the measuring device and eight voltages feeding the eight nearest neighbor wires. The reason for two $V_{dd}$ lines is to separate the $V_{dd}$ for the measuring structure from the $V_{dd}$ feeding the eight inverters, to reduce noise.

This last technique is particularly useful for library validation. Library validation is the process of building sufficient structures to be measured within the same integrated circuit chip to characterize a design. Typically, these libraries can be large but kept reasonably small with non simultaneous switching, as described above. The technique of the invention can also be used to optimize process parameters based on wire timing considerations.

Figure 8:
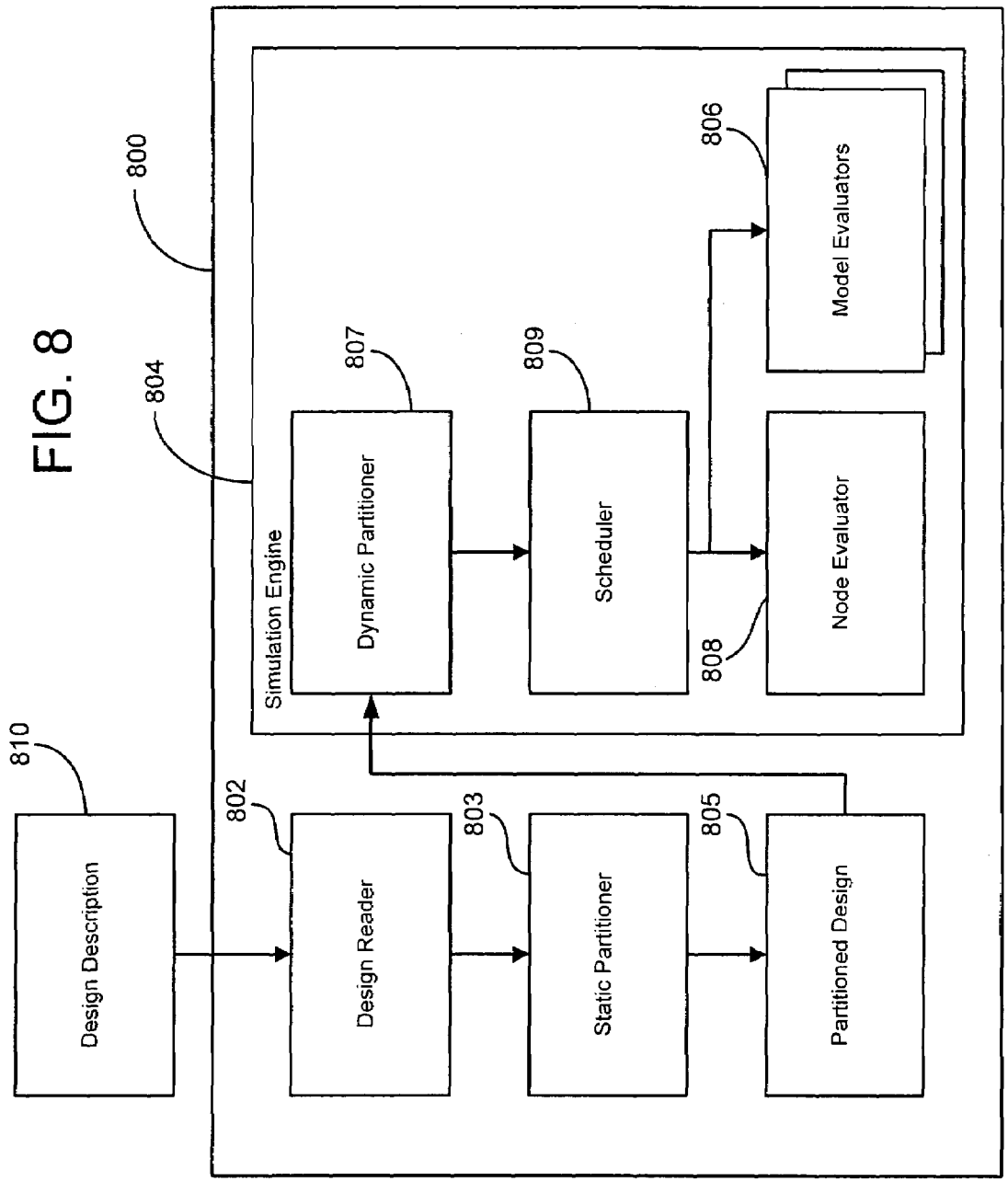
FIG. 8 is a block diagram illustrating an overview of an IC design simulation tool.

FIG. 8 is a block diagram illustrating an overview of an IC design simulation tool. As illustrated, IC design simulation tool 800 is constituted with design reader 802, static partitioner 803 and simulation engine 804 comprising dynamic partitioner 807, scheduler 809, node evaluator 808, and model evaluators 806. The elements are operatively coupled to each other as shown. Design reader 802 and some model evaluators 806, in particular a transistor model evaluator and a wire model evaluator, are incorporated with the teachings of the present invention. Certain aspects of static partitioner 803, dynamic partitioner 807, and scheduler 809, are the subject of co-pending U.S. patent application Ser. No. 09/333,124, filed Jun. 14, 1999, now granted as U.S. Pat. No. 6,480,816, entitled "CIRCUIT SIMULATION USING DYNAMIC PARTITION AND ON-DEMAND EVALUATION" which is hereby frilly incorporated by reference.

In one embodiment, the model evaluators evaluate transistor models and wire models having capacitance determined as described above. The capacitance information, both cross-coupling capacitance and total capacitance, can be combined with other device modeling information to provide accurate models and evaluations of the models.

Design reader 802 is used to read design description 810 provided by a designer. Design description 810 includes connectivity information connecting various models modeling electronic devices in the IC design. In one embodiment, in addition to flattening a hierarchical design, design reader 802, also assigns device characterizations to selected ones of the electronic devices of the IC design. In one embodiment the device characterizations are determined as described above. Static partitioner 803 pre-compiles or pre-partitions the IC design into static partitions as well as pre-processes the static partitions into a form particularly suitable for the dynamic partitioner 807.

During simulation, dynamic partitioner 807 further forms and re-forms dynamic partitions of the IC design that are relevant, referencing the pre-formed static partitions. Scheduler 809 determines whether evaluations are necessary for the dynamic partitions for the particular simulation time step, and schedules the dynamic partitions for evaluation on an as-needed or on-demand basis. Accordingly, node evaluator 807 and model evaluators 806 are selectively invoked on an as-needed or on-demand basis to evaluate the states of the connections connecting the models, and various parameter values of the models, such as current, voltage and so forth, respectively.

In one embodiment, at least one of the model evaluators adaptively performs the model evaluations at different accuracy or performance levels in accordance with the assigned device characterizations of the devices. Where accuracy is needed, the evaluations are performed through matrix solution. Formation of static partitions, and formation of dynamic partitions as well as scheduling evaluations on demand, i.e. on an as needed basis are explained in the above identified incorporated by reference co-pending U.S. patent applications. Further detail with respect to circuit simulation is provided in and co-pending U.S. patent application Ser. No. 09/333,122, filed Jun. 14, 1999, and entitled "ADAPTIVE INTEGRATED CIRCUIT DESIGN SIMULATION TRANSISOR MODELING AND EVALUATION," which is hereby incorporated by reference.

Figure 9:
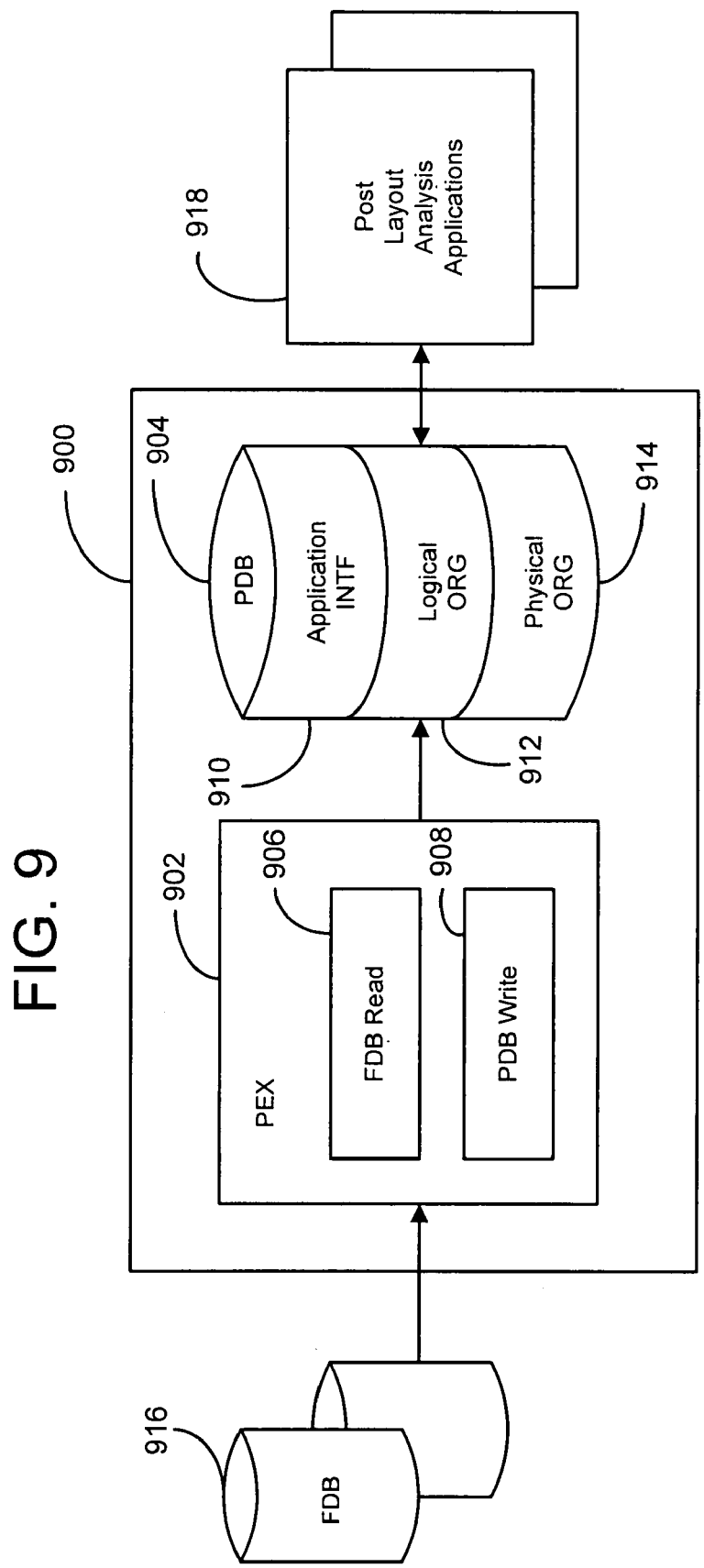
FIG. 9 is a block diagram one embodiment of a parasitic extraction tool suitable for use with the present invention.

FIG. 9 is a block diagram illustrating one embodiment of a parasitic extraction tool suitable for use with the present invention. As illustrated, the present invention includes parasitic extraction tool (PEX) 902 and parasitic database (PDB) 904. PEX 902 generates electrical modeling data for layout nets of an IC design, e.g. a deep sub-micron IC design, and stores the generated electrical modeling data in PDB 904 for use by client applications, such as post layout analysis applications 918. Examples of post-layout analysis applications 918 include Delay Calculator by Ultima Technology of Sunnyvale, Calif., and Path Mill and Time Mill by Synopsis Inc. of Mountain View, Calif.

PEX 902 generates the electrical modeling data for the layout nets using extracted connectivity and geometrical data of the layout nets. In one embodiment PEX 902 generates capacitive modeling data as described above. As shown, PEX 902 includes read function 906 that operates to input these connectivity and geometrical data of the layout nets. For the illustrated embodiment, the extracted connectivity and geometrical data of the layout nets are input from filtered databases (FDB) 916.

The extracted connectivity and geometrical data are stored in FDB 916 by layout cell hierarchies, one FDB per layout cell hierarchy, and indexed by layout nets. The connectivity and geometrical data were extracted at least in part in accordance with specified parasitic effect windows of the various layers of the IC design. Read function 906 operates to retrieve the connectivity and geometrical data of the layout nets from FDB 916 using the stored layout net indices. FDB 916 is the subject of co-pending U.S. patent application Ser. No. 09/052,895, filed Mar. 31, 1998, now granted as U.S. Pat. No. 6,230,299, entitled "METHOD AND APPARATUS FOR EXTRACTING AND STORING CONNECTIVITY AND GEOMETRICAL DATA FOR A DEEP SUB-MICRON INTEGRATED CIRCUIT DESIGN," which is assigned to the corporate assignee of the present invention. The co-pending application is hereby fully incorporated by reference.

PDB 904 is designed to accommodate a large volume of electrical modeling data and concurrent accesses by multiple client applications, which is typically of today's and future deep sub-micron IC designs and design environments. For the illustrated embodiment, PDB 904 has physical organization 914 that allows a large volume of electrical modeling data to be stored in multiple physical media, and application interface 910 that shields physical organization 914 from PDB users, e.g. PEX 902 and post layout analysis applications 918. Additionally, PDB 902 has logical organization 912 that abstracts physical organization 914 to facilitate implementation of application interface 910.

For the illustrated embodiment, PEX 902 includes write function 908 that operates to store the generated electrical modeling data of the layout nets into PDB 904 using application interface 910. In alternate embodiments, write function 908 may store the generated electrical modeling data of the layout nets using either logical and/or physical organizations 912-914. Similarly, selected ones of the client applications, e.g. post-layout analysis applications 918, may also elect to access PDB 904 through logical and/or physical organizations 912-914.

Read function 906 and write function 908 are the subject of co-pending U.S. patent application Ser. No. 09/052,915, filed Mar. 31, 1998, now granted as U.S. Pat. No. 6,249,903, entitled "METHOD AND APPARATUS FOR GENERATING AND MAINTAINING ELECTRICAL MODELING DATA FOR A DEEP SUB-MICRON INTEGRATED CIRCUIT DESIGN," which is assigned to the corporate assignee of the present invention. The co-pending application is hereby fully incorporated by reference. Except for read function 906 and write function 908, PEX 902 is intended to represent a broad category of electrical modeling tools known in the art. Examples of these electrical modeling tools include but not limited to Pattern Engine of xCalibre by Mentor Graphics, Columbus by Frequency Technology of San Jose, Calif., and Arcadia by Synopsis.

Figure 10:
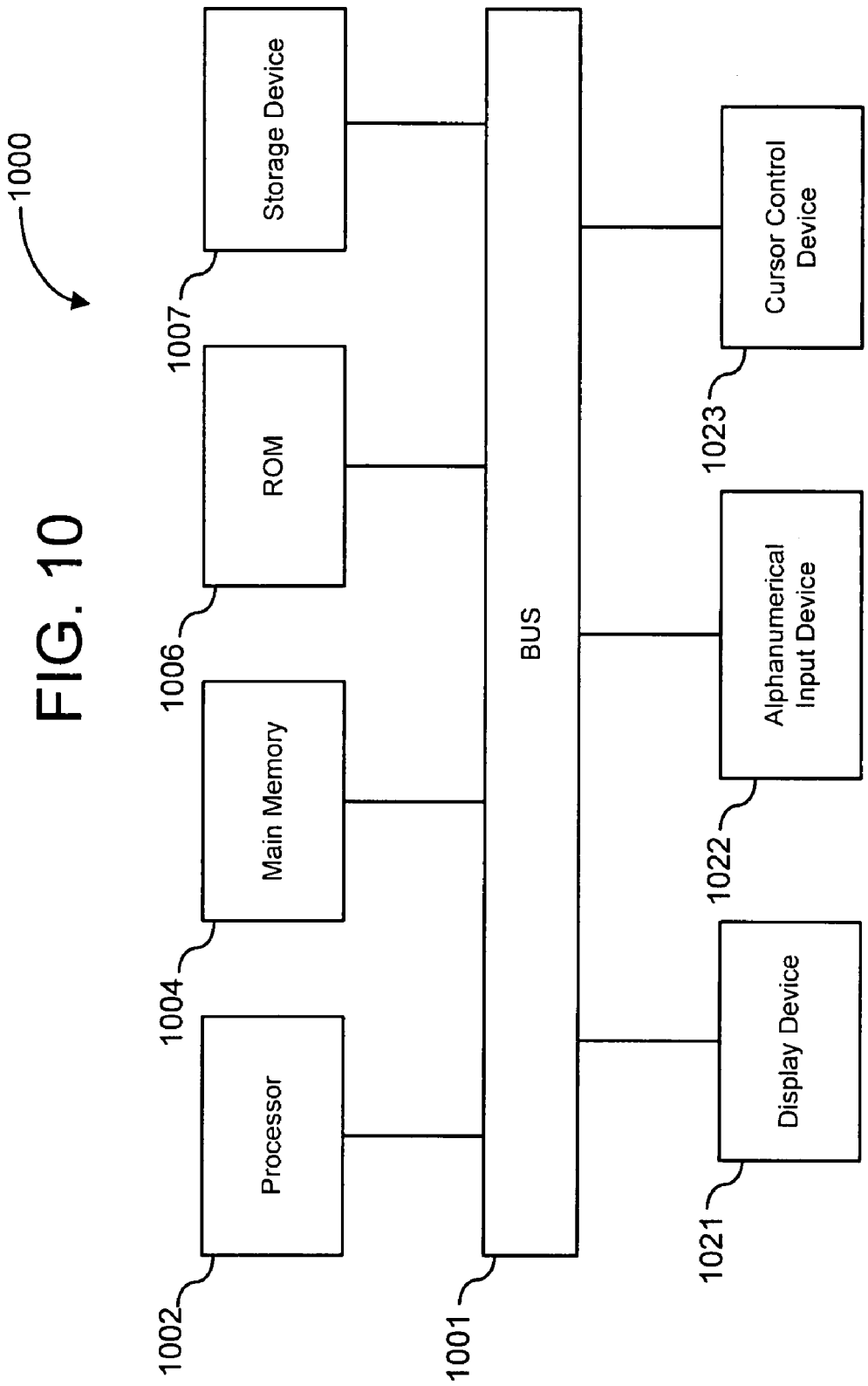
FIG. 10 is one embodiment of a computer system suitable for use with the invention.

FIG. 10 is one embodiment of a computer system suitable for use with the invention. Computer system 1000 can be used, for example, for extraction and/or modeling of integrated circuits using the teachings of the present invention. Computer system 1000 includes bus 1001 or other communication device to communicate information and processor 1002 coupled to bus 1001 to process information. While computer system 1000 is illustrated with a single processor, computer system 1000 can include multiple processors and/or co-processors. Computer system 1000 further includes random access memory (RAM) or other dynamic storage device 1004 (referred to as main memory), coupled to bus 1001 to store information and instructions to be executed by processor 1002. Main memory 1004 also can be used to store temporary variables or other intermediate information during execution of instructions by processor 1002.

Computer system 1000 also includes read only memory (ROM) and/or other static storage device 1006 coupled to bus 1001 to store static information and instructions for processor 1002. Data storage device 1007 is coupled to bus 1001 to store information and instructions. Data storage device 1007 such as a magnetic disk or optical disc and corresponding drive can be coupled to computer system 1000.

Computer system 100 can also be coupled via bus 1001 to display device 1021, such as a cathode ray tube (CRT) or liquid crystal display (LCD), to display information to a computer user. Alphanumeric input device 1022, including alphanumeric and other keys, is typically coupled to bus 1001 to communicate information and command selections to processor 1002. Another type of user input device is cursor control 1023, such as a mouse, a trackball, or cursor direction keys to communicate direction information and command selections to processor 1002 and to control cursor movement on display 1021.

According to one embodiment, extraction and/or modeling can be performed by computer system 1000 in response to processor 1002 executing sequences of instructions contained in main memory 1004. Instructions are provided to main memory 1004 from a storage device, such as magnetic disk, a read-only memory (ROM) integrated circuit (IC), CD-ROM, DVD, via a remote connection (e.g., over a network), etc. In alternative embodiments, hard-wired circuitry can be used in place of or in combination with software instructions to implement the present invention. Thus, the present invention is not limited to any specific combination of hardware circuitry and software instructions.

In the foregoing specification, the invention has been described with reference to specific embodiments thereof (the measurement of a Metal2 wire capacitance coupling to another Metal2 wire). It will, however, be evident that various modifications and changes can be made thereto without departing from the broader spirit and scope of the invention. The specification and drawings are, accordingly, to be regarded in an illustrative rather than a restrictive sense.

The invention claimed is:

1. A method for measuring cross-coupling capacitance, comprising:
   providing at least first and second wires;
   charging the first wire to a predetermined voltage;
   performing a first measurement to determine the charge required to charge the first wire to the predetermined voltage and thereby associated with a capacitance of the first wire;
   charging the second wire to the predetermined voltage;
   discharging the first wire;
   recharging the first wire, following the act of discharging the first wire, to the predetermined voltage;
   performing a second measurement to determine the charge required to recharge the first wire to the predetermined voltage with the second wire at the predetermined voltage and thereby associated with a capacitance of the first wire; and
   calculating a difference between the first and second measurements to determine the cross-coupling capacitance between the first and second wires.

2. The method of claim 1, further including coupling a first transistor between a supply voltage and a common node, coupling a second transistor in series with the first transistor between the common node and ground, wherein the first wire is coupled to the common node.

3. The method of claim 2, further including applying a first periodic signal to a gate of the first transistor and a second periodic signal to a gate of the second transistor, to periodically charge and discharge the first wire.

4. The method of claim 3, wherein the first periodic signal and the second periodic signal are timed so that the first and second transistors are not activated simultaneously.

5. The method of claim 2, further including using the first transistor and second transistor in conjunction with the first wire to measure each cross-coupling capacitance of multiple neighbor wires to the first wire.

6. The method of claim 5, wherein the multiple neighbor wires are in an integrated circuit with multiple metal layers and the neighbor wires can be on any layer and in any orientation relative to each other and to the first wire.

7. The method of claim 2, further including coupling an ammeter in series with the first and second transistors, and wherein the first and second measurements include measuring a current needed to charge the first wire to the predetermined voltage.

8. The method of claim 2, further including using the first transistor and second transistor in conjunction with the first wire to measure each cross-coupling capacitance of multiple neighbor wires to the first wire and wherein the measurements of each cross-coupling capacitance is accomplished with one library element.

9. The method of claim 1, further including discharging the second wire prior to charging the first wire.

10. The method of claim 1, further including measuring each of the cross-coupling capacitances for multiple neighbor wires to the first wire.

11. The method of claim 10, wherein measuring the cross-coupling capacitance for the neighbor wires is performed using a same technique as used to measure the cross-coupling capacitance between the first wire and the second wire and using the same transistor configuration.

12. The method of claim 1, further including repeating the charging of the first and second wires, repeating the first and second measurements over a number of cycles and calculating an average of the measurements to calculate the difference.

13. The method of claim 1, wherein performing the first and second measurements includes measuring an amount of charge used to charge the first wire to the predetermined voltage.

14. The method of claim 1, wherein the first and second wires are unconnected and further including coupling logic to the second wire to charge and discharge the second wire.

15. The method of claim 14, wherein the logic is an inverter.

16. The method of claim 1, wherein the cross-coupling capacitance is calculated between the first and second wires using only a single ammeter.

17. The method of claim 1, wherein the predetermined voltage is a logic high voltage level.

18. The method of claim 1, further including:
a) measuring each of the cross-coupling capacitances for multiple neighbor wires to the first wire;
b) charging the multiple neighbor wires to a high voltage level;
c) measuring a capacitance to ground for the first wire; and
d) adding the capacitance to ground measurement to the cross-coupling capacitance measurements to determine the total capacitance associated with the first wire.

19. A circuit for measuring cross-coupling capacitance, comprising:
first and second transistors coupled in series;
an ammeter coupled in series with the first and second transistors;
a first wire coupled between the first and second transistors;
a second wire unconnected to the first wire, the second wire also being unconnected to the ammeter through a transistor and unconnected to any other ammeter through a transistor, but the second wire being in fixed relation to the first wire such that a cross-coupling capacitance is created between the first and second wires; and
wherein the cross-coupling capacitance is measured between the first and second wires by subtracting two capacitance-related measurements associated with the first wire, one of the measurements being performed with the second wire at a first voltage level and the other of the measurements being performed with the second wire charged to a second voltage level.

20. The circuit of claim 19, wherein the first voltage level is ground and the second voltage level is a logic high.

21. The circuit of claim 19, further including logic coupled to the second wire for charging and discharging the second wire.

22. The circuit of claim 21, wherein the logic includes an inverter.

23. The circuit of claim 19, wherein the first and second transistors each have source-to-drain paths, wherein the source-to-drain paths of each transistor are coupled in series between power and ground, with gates of the first and second transistors coupled to different periodic signals for controlling the charging and discharging of the first wire.

24. The circuit of claim 23, wherein the periodic signals are timed such that the first and second transistors are not activated simultaneously, and only two periodic signals are used to control the charging of the first wire, and only one periodic signal is used to control the second wire.

25. The circuit of claim 19, wherein the first and second wires can be in any configuration to each other including being in parallel to each other.

26. The circuit of claim 19, wherein only one ammeter is used in the measurement of the cross-coupling capacitance.

27. The circuit of claim 19, further including measuring the cross-coupling capacitance for multiple neighbor wires to the first wire.

28. The circuit of claim 27, wherein measuring the cross-coupling capacitance for the neighbor wires is performed using a same technique as used to measure the cross-coupling capacitance between the first wire and the second wire and using the same transistor configuration.

29. The circuit of claim 27, wherein the multiple neighbor wires are in an integrated circuit with multiple metal layers and the neighbor wires can be on any of the metal layers and in any orientation relative to each other and relative to the first wire.

30. The circuit of claim 19, further including using the first transistor and second transistor in conjunction with the first wire to measure each cross-coupling capacitance of multiple neighbor wires to the first wire and wherein the measurements of each cross-coupling capacitance is accomplished with one library element.

31. A circuit for calculating a cross-coupling capacitance between first and second wires, comprising:
means for charging and discharging a first wire;
means for measuring charge on the first wire in order to calculate capacitance associated with the first wire;
means for charging and discharging a second wire; and
means for calculating a cross-coupling capacitance from two measurements, the first of the two measurements corresponding to the charge needed to charge the first wire to a predetermined voltage with the second wire grounded and the second of the two measurements corresponding to the charge needed to charge the first wire to the predetermined voltage with the second wire charged to the predetermined voltage and taking a difference between the two measurements.

32. The circuit of claim 31, wherein the means for charging the second wire includes logic means.

33. The circuit of claim 31, wherein the means for measuring charge includes an ammeter.

34. The circuit of claim 31, wherein the means for charging and discharging the first wire includes serially coupled transistor means, wherein the first wire is coupled between the serially coupled transistors.

* * * * *